(12) United States Patent
Kapels et al.

(10) Patent No.: US 6,734,520 B2
(45) Date of Patent: May 11, 2004

(54) SEMICONDUCTOR COMPONENT AND METHOD OF PRODUCING IT

(75) Inventors: Holger Kapels, Holzkirchen (DE); Dieter Silber, Obertshausen (DE); Robert Plikat, Freiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/861,427

(22) Filed: May 18, 2001

(65) Prior Publication Data

US 2003/0094623 A1 May 22, 2003

Related U.S. Application Data

(63) Continuation of application No. PCT/DE99/03680, filed on Nov. 18, 1999.

(51) Int. Cl.[7] ............... H01L 27/095; H01L 27/102; H01L 31/107
(52) U.S. Cl. ............... 257/483; 257/605; 257/582; 257/583
(58) Field of Search ............... 257/483, 605, 257/582, 583, 386, 350

(56) References Cited

U.S. PATENT DOCUMENTS

| | | | |
|---|---|---|---|
| 3,571,675 A | * 3/1971 | Faust | 148/DIG. 139 |
| 4,646,115 A | 2/1987 | Shannon et al. | |
| 4,651,407 A | 3/1987 | Bencuya | |
| 5,218,226 A | * 6/1993 | Slatter et al. | 257/239 |
| 5,569,941 A | * 10/1996 | Takahashi | 257/132 |
| 5,703,384 A | 12/1997 | Brunner | |
| 5,894,149 A | 4/1999 | Uenishi et al. | |
| 6,091,108 A | * 7/2000 | Harris et al. | 257/135 |

FOREIGN PATENT DOCUMENTS

| | | |
|---|---|---|
| DE | 196 04 044 A1 | 8/1997 |
| DE | 196 51 108 A2 | 10/1997 |
| DE | 196 31 872 A1 | 2/1998 |
| EP | 0 768 717 A2 | 4/1997 |
| JP | 07-106550 A | 4/1995 |

OTHER PUBLICATIONS

Plikat et al.: "Very High Voltage Integration in SOI Based on a New Floating Channel Technology", Annual IEEE International Silicon–on–Insulator Conference, vol. 24, New York 1998, pp. 59–60.

* cited by examiner

Primary Examiner—Amir Zarabian
Assistant Examiner—Kiesha Rose
(74) Attorney, Agent, or Firm—Laurence A. Greenberg; Werner H. Stemer; Gregory L. Mayback

(57) ABSTRACT

A semiconductor component includes a first layer and at least one adjacent semiconductor layer or metallic layer, which forms a rectifying junction with the first layer. Further semiconductor layers and metallic layers are provided for contacting the component. Insulating or semi-insulating structures are introduced into the first layer in a plane parallel to the rectifying junction. These structures are shaped like dishes with their edges bent up towards the rectifying junction. A method of producing such a semiconductor component is also provided.

31 Claims, 10 Drawing Sheets

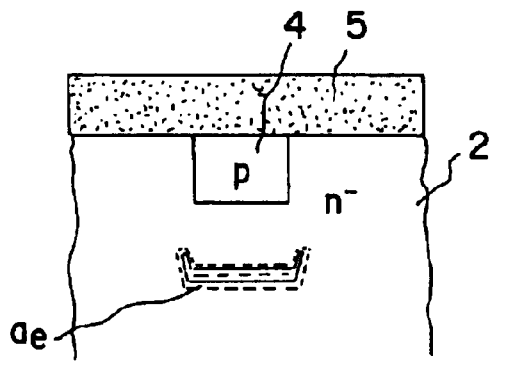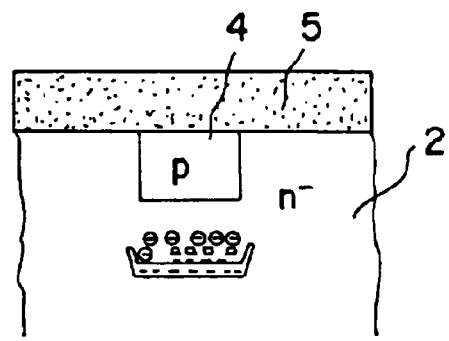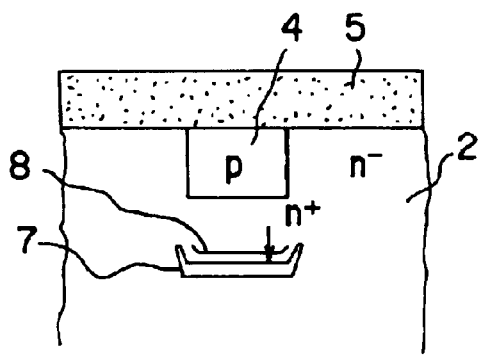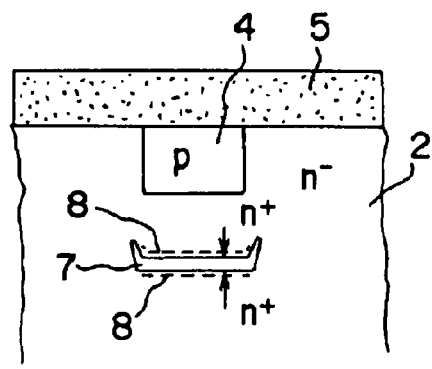

SEMICONDUCTOR COMPONENT AND METHOD OF PRODUCING IT

CROSS-REFERENCE TO RELATED APPLICATION

This application is a continuation of copending International Application No. PCT/DE99/03680, filed Nov. 18, 1999, which designated the United States.

BACKGROUND OF THE INVENTION

Field of the Invention

The invention relates to a semiconductor component such as a diode or a transistor having dielectric shielding structures and to a method of producing such a semiconductor component. The shielding structures results in a high blocking capability of the semiconductor component, without significantly reducing the conductivity.

B. J. Baliga, "Modern Power Devices" (John Wiley & Sons, 1987, Section 6) describes a unipolar power transistor, which can be switched through the use of MOS structures. When such a transistor is configured for higher blocking capabilities, the resistance rises considerably, above a blocking capability of about 150 V in accordance with a power rule, with the exponent of the maximum blocking voltage being about 2.5 (page 295 of the textbook cited above).

U.S. Pat. No. 5,216,275 1993 discloses this unsuitable profile being avoided by producing column-like structures of the opposite conductivity type a short distance apart in the layer across which the voltage is dropped. This method is highly complex. In addition, it leads to the component having a very high capacitance. In consequence, its advantages are reduced at high switching frequencies (>100 kHz).

Similar relationships between the switched-on resistance and the conductivity also apply to unipolar rectifiers. The column structure also results in corresponding advantages in components such as these, and the increased capacitance is disadvantageous in a corresponding manner.

Lateral semiconductor components with layers of alternating conductivity have been proposed in an analogous manner in European Patent No. 0 053 854.

B. J. Baliga, "Modern Power Devices" (John Wiley & Sons, 1987, Section 3) describes measures with which the edge area of a semiconductor component can be configured such that this edge area is protected against voltage breakdowns, thus ensuring the high blocking capability of the component. "Technical Digest 1985 International Electron Devices Meeting, December 1986, Washing DC (IEEE Catalog Number: 85CH2252-5)" describes, on pages 154–157, a particularly advantageous version of such an edge area which can be easily produced.

SUMMARY OF THE INVENTION

It is accordingly an object of the invention to provide semiconductor components which overcome the above-mentioned disadvantages of the heretofore-known components of this general type and which have a low switched-on resistance, which likewise have a high blocking capability but can be produced easily. Furthermore, if configured suitably, the capacitance of these components can be kept lower than is the case with the known solutions. In addition, the edge area of the components is to be protected against voltage breakdowns. A further object of the invention is to provide a method of manufacturing such a semiconductor component.

With the foregoing and other objects in view there is provided, in accordance with the invention, a semiconductor configuration, including:

a semiconductor component including a first layer, a second layer adjacent the first layer, and dish-shaped structures disposed in the first layer, the semiconductor component defining a current flow direction along a movement direction of current-carrying charge carriers;

the second layer being a layer selected from a semiconductor layer or a metal layer forming an electrode for providing an electrical connection; and the dish-shaped structures being formed of a material selected from an insulating material or a semi-insulating material; and the dish-shaped structures having respective main surfaces extending substantially perpendicular to the current flow direction.

According to another feature of the invention, the dish-shaped structures are configured as layer sequences of insulating material and semi-insulating material; the dish-shaped structures have outer layers; and at least one of the outer layers is composed of a semi-insulating material.

According to another feature of the invention, the dish-shaped structures are composed of insulating material; and each of the dish-shaped structures has an edge region with an additional layer disposed in the edge region, the additional layer is composed of a material selected from the group consisting of an insulating material and a semi-insulating material.

According to another feature of the invention, the dish-shaped structures have outer surfaces and are formed with depressions distributed regularly or randomly on at least one of the outer surfaces.

According to another feature of the invention, the semiconductor component has a unipolar current guidance, the dish-shaped structures have respective edges bent up with respect to the current flow direction of the current-carrying charge carriers.

According to another feature of the invention, the first layer and the second layer form a rectifying junction; further layers selected from the group consisting of semiconductor layers and metal layers are provided for making contact with the semiconductor component; and the dish-shaped structures are disposed substantially parallel to the rectifying junction.

According to another feature of the invention, the dish-shaped structures have respective edges bent up toward the rectifying junction.

According to another feature of the invention, the dish-shaped structures have respective edges, the edges are provided with a conductivity doping; and the first layer has a given conductivity type, the conductivity doping has a conductivity type opposite the given conductivity type.

According to another feature of the invention, a maximum distance between adjacent ones of the dish-shaped structures is less than a maximum extent of a space-charge zone in the first layer.

According to another feature of the invention, the dish-shaped structures form a cohesive overall structure.

According to another feature of the invention, the cohesive overall structure is formed with openings having a maximum diameter of less than a maximum extent of a space-charge zone in the first layer.

According to another feature of the invention, the semiconductor component has a unipolar current guidance, the dish-shaped structures have respective outer surfaces formed with depressions facing the current flow direction.

According to another feature of the invention, the dish-shaped structures have respective outer surfaces formed with depressions facing the rectifying junction.

According to another feature of the invention, the first layer defines a plurality of planes, the dish-shaped structures are disposed in respective ones of the plurality of planes.

According to another feature of the invention, spaces between respective ones of the dish-shaped structures disposed in a given one of the planes are each provided above further ones of the dish-shaped structures disposed in an adjacent one of the planes such that the spaces are each located above closed regions of the adjacent one of the planes.

According to another feature of the invention, the dish-shaped structures are insulating structures with fixed charges introduced therein, the fixed charges are positive if the first layer conducts electrons, and the fixed charges are negative if the first layer conducts holes.

According to another feature of the invention, each of the dish-shaped structures has a flat layer with an increased conductivity doping provided on at least one side of each of the dish-shaped structures, the flat layer having a conductivity type corresponding to a conductivity type of the first layer.

According to another feature of the invention, the semiconductor component is a unipolar rectifier.

According to another feature of the invention, the semiconductor component is a unipolar rectifier with shielding pn junctions incorporated therein, the shielding pn junctions being merged rectifier-type structures.

According to another feature of the invention, the dish-shaped structures are located underneath the shielding pn junctions.

According to another feature of the invention, the semiconductor component is a vertical field-controlled transistor.

According to another feature of the invention, the semiconductor component has pn junctions formed with curvatures, the dish-shaped structures are disposed underneath the curvatures of the pn junctions where an electrical field strength assumes a highest value when a reverse voltage is applied.

According to another feature of the invention, the semiconductor component has a rectifying junction, the dish-shaped structures are disposed closer to the rectifying junction than required for limiting a semiconductor breakdown field strength.

According to another feature of the invention, the semiconductor component is a vertical, bipolar semiconductor component having an integrated pnp transistor zone sequence with pn junctions, the dish-shaped structures are associated with one of the pn junctions used as a hole emitter.

According to another feature of the invention, the semiconductor component has a $p^+$ emitter and given regions provided between the $p^+$ emitter and the dish-shaped structures such that a carrier life is shortened in the given regions.

According to another feature of the invention, the dish-shaped structures are assigned to respective ones of the pn junctions of the integrated pn transistor.

According to another feature of the invention, shielding structures are introduced from a surface of the semiconductor component and disposed in an edge region of the semiconductor component, the shielding structures have edges bent up toward a rectifying pn junction of the semiconductor component.

According to another feature of the invention, shielding structures are introduced from a surface of the semiconductor component and disposed in an edge region of the semiconductor component, the shielding structures being incorporated obliquely such that the shielding structures form edges bent toward a rectifying pn junction of the semiconductor component With the objects of the invention in view there is also provided, a method for producing a semiconductor configuration, the method which includes:

forming a layer with a given thickness;

producing, in the layer, one of insulating structures and semi-insulating structures by photochemical masking processes and implantation of ions, the one of insulating structures and semi-insulating structures having respective surfaces extending substantially perpendicular to a current flow direction; and further building up the layer to a thickness greater than the given thickness by using epitaxy steps subsequent to removing a photo mask.

Another mode of the invention includes forming depressions in a geometric configuration of the one of insulating structures and semi-insulating structures through the use of wet-chemical or dry-chemical etching processes before the implantation; and forming the one of insulating structures and semi-insulating structures with a same masking as used for forming the depressions.

Another mode of the invention includes producing additional semi-insulating layers with a same masking as used for forming the one of insulating structures and semi-insulating structures.

Another mode of the invention includes producing additional layers of increased dopant concentration with a same masking as used for forming the one of insulating structures and semi-insulating structures.

Another mode of the invention includes producing the one of insulating structures and semi-insulating structures by implanting one of oxygen and nitrogen.

Other features which are considered as characteristic for the invention are set forth in the appended claims.

Although the invention is illustrated and described herein as embodied in a semiconductor component having dielectric or semi-insulating shielding structures and a method of producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 7a and 7b are diagrammatic, partial sectional views of semiconductor components having shielding structures according to the invention;

FIG. 8 is a diagrammatic, partial sectional view of a semiconductor component having a shielding structure according to the invention;

FIG. 9 is a diagrammatic, partial sectional view of a semiconductor component having a shielding structure according to the invention;

DESCRIPTION OF THE PREFERRED EMBODIMENTS

Figure 1:
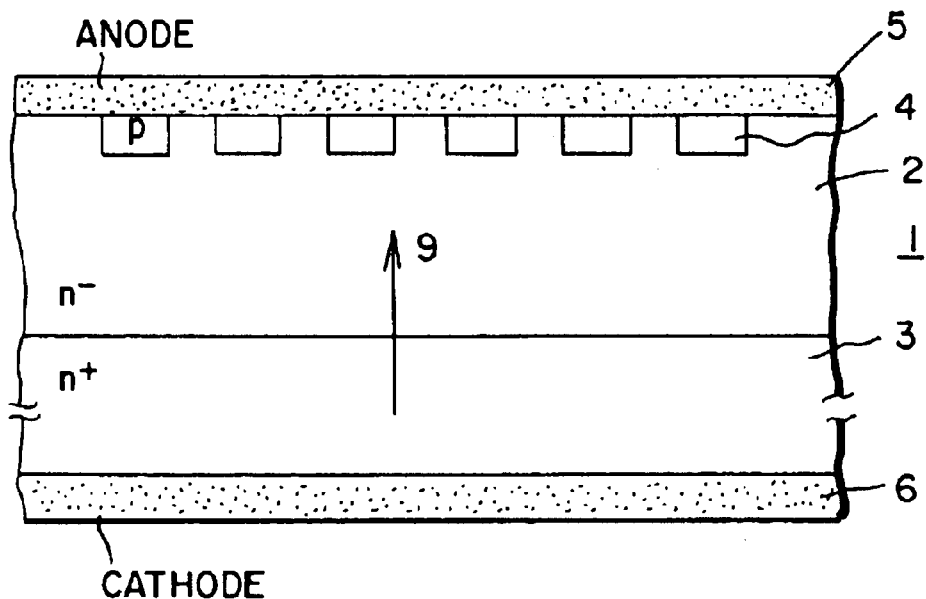
FIG. 1 is a diagrammatic, partial sectional view of a unipolar rectifier structure.

Referring now to the figures of the drawings in detail and first, particularly, to FIG. 1 thereof, there is shown a structure of a unipolar rectifier, to be precise in the form of a silicon Schottky diode. The embodiment of a "merged rectifier" is chosen here, since the advantages of the solution according to the invention are particularly pronounced in this component.

First of all, the component 1 includes two semiconductor layers of the n-type, a weakly doped layer 2 and an adjacent, highly doped layer 3.

Island or grid structures 4 of the p-type are incorporated in the weakly doped layer 2. The dimensioning of the layers and their dopant concentrations are, in principle, known. Furthermore, there is a metal layer 5 on the grid-side surface and, with the n-layer 2, this forms a rectifying metal-semiconductor contact in a known manner. This metal layer forms the anode metalization of the rectifier. Adjacent to the $n^+$-layer 3 there is a metal layer 6 which forms a non-rectifying contact and represents the cathode-side metalization. In particular, the thickness and dopant concentration of the layer 2 must be chosen such that the space-charge zone formed during blocking can be used to drop all the blocking voltage without excessively high electrical field strengths leading to avalanche breakdown. This means that the layer thickness of 2 must be chosen to be somewhat more than proportional to the intended maximum blocking voltage. At the same time, the conductivity doping is reduced. This combination of measures results in the relationship mentioned initially between the forward resistance and the blocking capability ($\approx$ power of 2.5).

The grid structure 4 would, in principle, not be required for metal-semiconductor diodes. However, in components with a high blocking capability, it is expedient since, with suitable dimensioning (known from the literature), it leads to the metal-semiconductor junction not being located in a high field-strength area. This configuration is referred to as "merged rectifier".

Figure 2A:
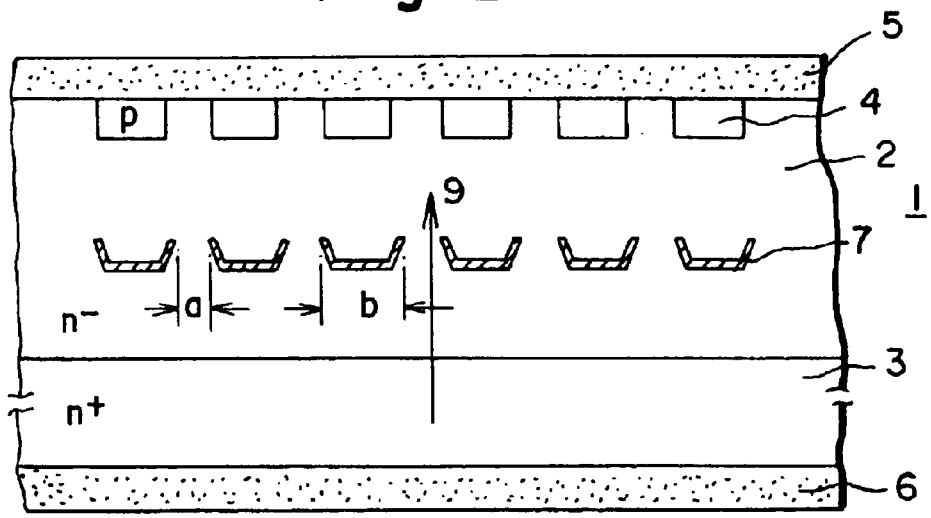
FIGS. 2a and 2b are diagrammatic, partial sectional views of semiconductor components having shielding structures according to the invention.

In FIG. 2a, the known structure 1 is modified and is supplemented by additional structures 7 in the form of dishes to achieve the effect according to the invention.

The rectifier 1 contains all the layers indicated in FIG. 1. However, in addition, it contains incorporated insulating structures 7 in the form of a flat dish. These insulating structures 7 lie parallel to the outer layers. When the blocking voltage is applied, they are at right angles to the electrical field direction. The distance a between the structures 7 in the form of dishes must be less than the maximum permissible extent of the space-charge zone in layer 2.

The structures 7 are provided with an edge which is bent up with respect to the anode side. The height of this edge is typically 0.2 . . . 1 $\mu$m.

Figure 2B:
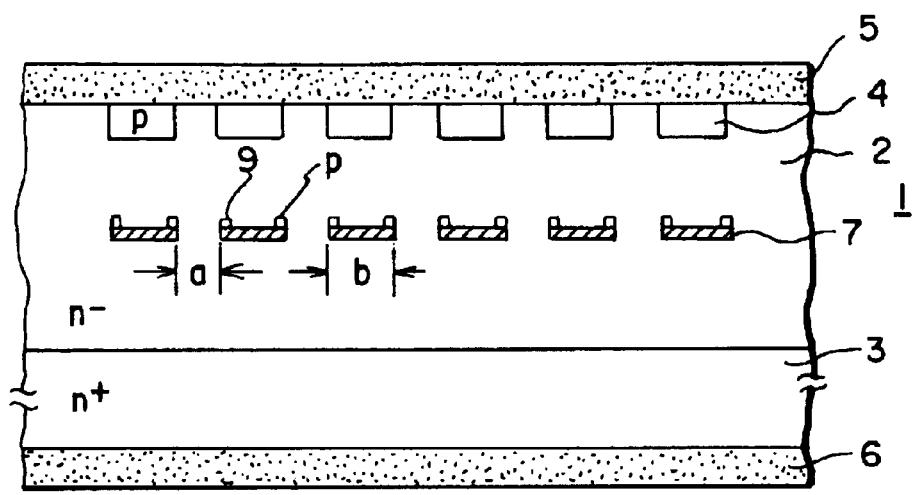

Instead of the bent-up edge, the edges of the structures 7 may also be provided with additional doping, with the conductivity type of this doping being opposite to that of the doping 9 of the layer 2, as is illustrated in FIG. 2b.

Figure 11:
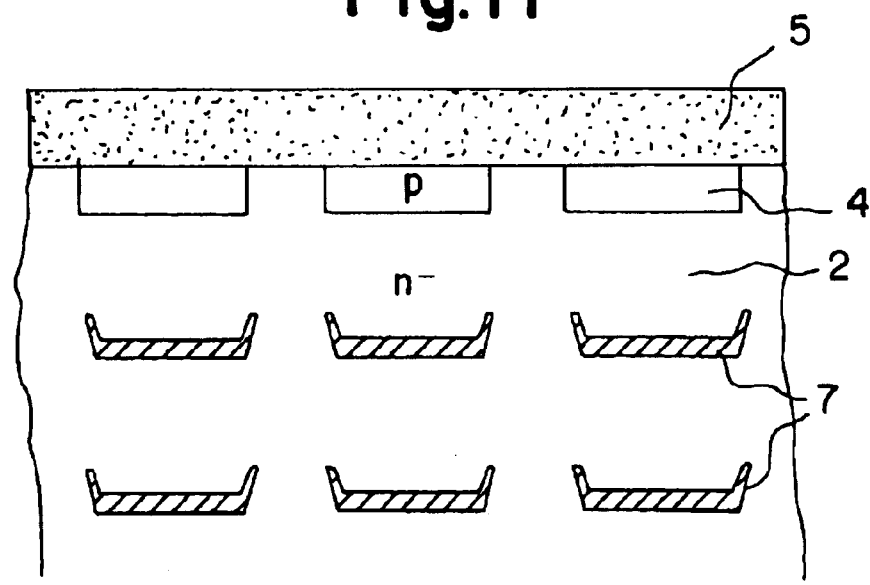
FIG. 11 is a diagrammatic, partial sectional view of a semiconductor component having shielding structures in several planes according to the invention.

As will be shown later with reference to FIG. 11, structures 7 in the form of dishes can be incorporated in a number of planes. The doping concentration is increased by a factor (n+1) where n is the number of planes in which the insulating dish structures 7 are located.

Figure 3A:
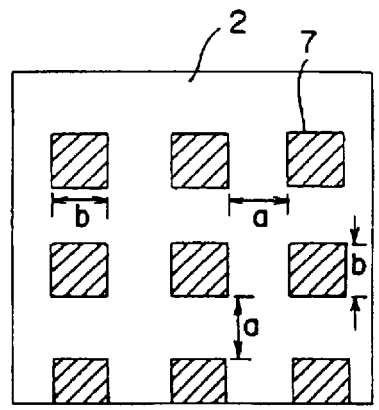
FIGS. 3a and 3b are diagrammatic plan views of semiconductor components having shielding structures according to the invention.
Figure 3B:
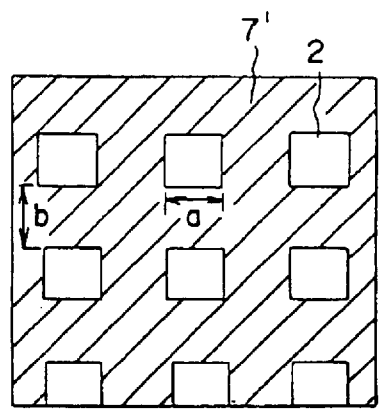

The insulating structures 7 can also be combined to form a common, large-area structure 7' provided with openings, as is shown in FIGS. 3a, 3b. In the same sense, the parameter a now corresponds to the diameter or to the side edges of the openings in the structure 7', and b to the width of the insulating areas between the openings.

For a silicon rectifier with a blocking capability of 600 V, for example, extents of between 5 and 15 $\mu$m would be chosen for a and b.

Figure 6A:
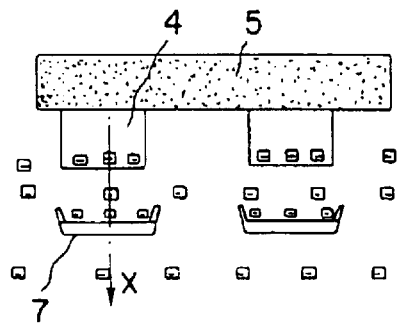
FIG. 6a is a diagrammatic, partial sectional view of a semiconductor component having shielding structures according to the invention.

FIG. 6a shows, schematically but approximately quantitatively correctly, the effect of the incorporated structures 7 in the form of dishes. The higher conductivity doping of the layer 2 would lead to avalanche breakdown on the grid structure 3 if a high blocking voltage were applied. However, those electrons which are drawn off when the space-charge zone expands toward the anode as well as those which occur if an avalanche breakdown were to occur are partially trapped in the structures 7 where they form an accumulation of negative charge. The maximum electrical field strength that occurs is thus reduced, and the further production of electrons and holes is suppressed.

It is thus possible to achieve a very much higher breakdown voltage despite the increased conductivity doping concentration in layer 2. To be precise, the structures 7, 7' each restrict the current-carrying area and, in consequence, reduce it somewhat on average, although the total resistance is nevertheless considerably lower than with the original structure shown in FIG. 1.

The capacitive charge which flows away during formation of the space-charge zone is greater than that shown in FIG. 1 only by the element resulting from any additional, brief avalanche breakdown. If the configuration of the structures 7 is sufficiently dense, this element can be kept low, in particular if a cohesive structure as shown in FIG. 3b is chosen.

Figure 4:
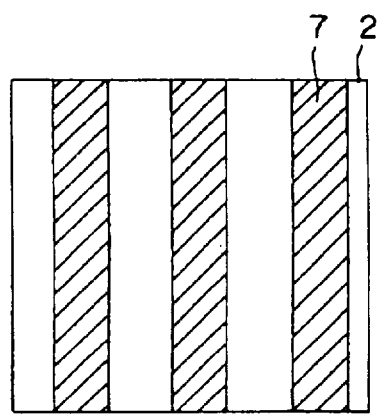
FIG. 4 is a diagrammatic plan view of a semiconductor component having shielding structures according to the invention.
Figure 5:
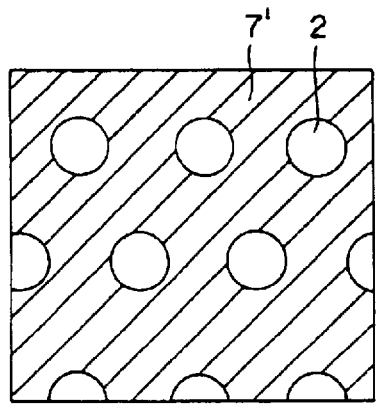
FIG. 5 is a diagrammatic plan view of a semiconductor component having shielding structures according to the invention.

In the previous examples, the configuration has been illustrated using a square matrix. However, the same effect is also achieved by strip structures as shown in FIG. 4 or hexagonal structures as shown in FIG. 5. Furthermore, there is no need for the grid structure of the "merged rectifier" (or any other components structured on the cathode side) to be related to the dimensioning of the structure 7 and, in fact, additional advantages can be achieved by association of the structures, as will be explained later.

Figure 6B:
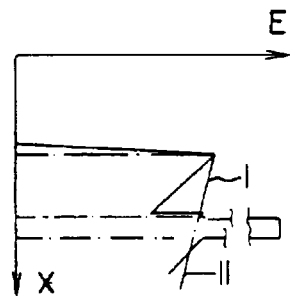
FIG. 6b is a graph illustrating a field strength profile.

FIGS. 6a and 6b illustrate schematically the method of operation, to be precise the charge state in the space-charge zone which is formed in layer 2 and the grid structures 4, when a high blocking voltage is applied. Only the positive charges of the donor ions occur as space charges in the layer 2 in the conventional structure of the merged rectifier, with the corresponding negative charges being formed in the layer 4 and, partially, in 5. The field-strength profile along axis X is shown in FIG. 6b (I). The gradient must be low (that is to say the conductivity doping as well) in order that the voltage (=area under the profile I) is sufficiently large.

Now, however, negative electrical charges are trapped in the structure according to the invention. Some of these originate from the n-region, while some are produced by impact ionization when the critical field strength is exceeded. These charges are trapped and capacitively fixed in the structures 7, since high potential energy is required for them to cross over the edges (II). Thermal excitation is not sufficient for this purpose, with the given edge heights. Any avalanche breakdown which may occur initially is thus self-limiting, this being achieved particularly effectively in Type 3b configurations (with a high surface-area element in the insulation structure).

In principle, the forward response of the component is adversely affected by the structure 7 to a lesser extent the smaller the dimensions a, b, that is to say a considerable reduction in size is advantageous for a given ratio of a and b.

It is advantageous for the insulating structures 7, 7' to be produced such that they contain fixed internal positive charges as illustrated in FIGS. 7a and 7b. When oxides are produced in silicon, this is otherwise a rather undesirable effect, which is suppressed technologically. However, in the present situation, electrons are enriched in the vicinity of the positive oxides (symbol $a_e$), so that it is easier for current to be carried around the insulation surface 7. When a blocking voltage is dropped across the component, the insulated dishes 7 will correspondingly trap more electrons, thus compensating for the positive charge.

A similarly advantageous effect occurs, as illustrated in FIGS. 8 and 9, if layers 8, 8' with an increased doping concentration are produced above the structures 7, or above and below them.

The previous component example relates to a unipolar rectifier (of the "merged rectifier" type), since this is the simplest structure for use of the measures according to the invention.

Figure 10:
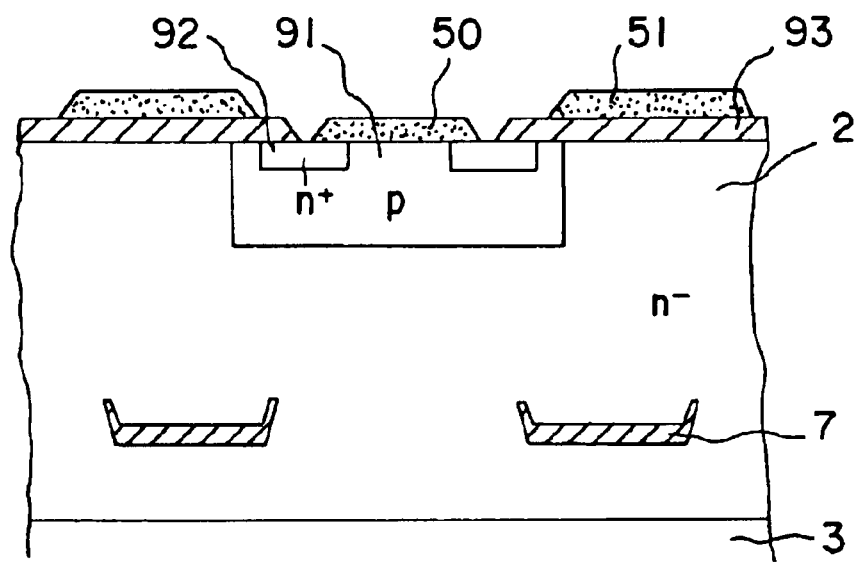
FIG. 10 is a diagrammatic, partial sectional view of a field effect transistor component having shielding structures according to the invention.

However, it is particularly important for vertical power MOS field-effect transistors (see FIG. 10). The structure including the semiconductor areas 91, 92, the gate oxide 93, the source metalization 50 and the gate electronics 51 is known from standard textbooks.

In the illustrated example, the configuration of the areas 7 is related to the structure 91 of the transistor. This is advantageous since avalanche breakdown can be expected to occur first of all at the edges of 91, and since the insulation structures in the illustrated configuration very effectively trap the electrons produced. In a similar way, it is thus also advantageous to relate them to the grid structure in the previous example of the "merged rectifier". In principle, the advantageous effect produced by the structures 7 also occurs, however, without any special association with the component structures on the cathode or source side.

Figure 12:
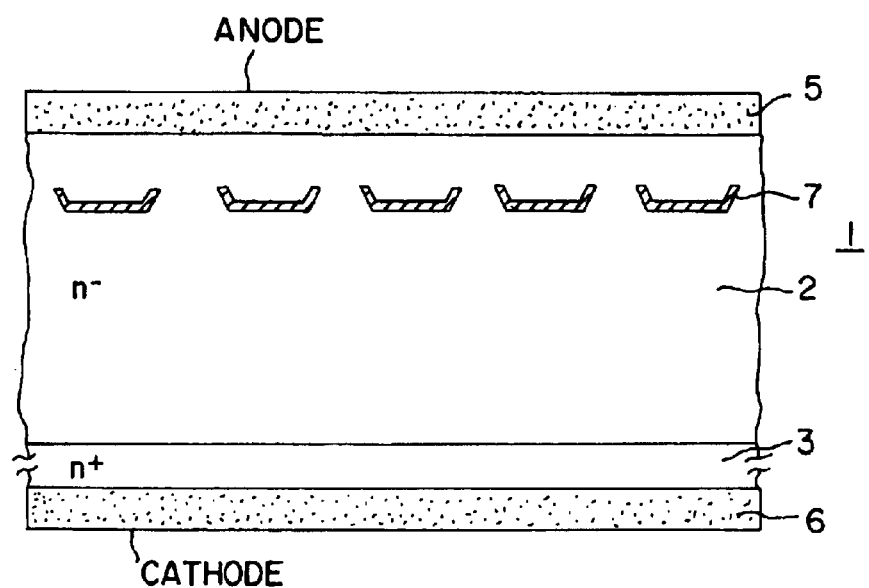
FIG. 12 is a diagrammatic, partial sectional view of a semiconductor component having shielding structure according to the invention.

The uses of the structures 7 are not restricted to a single plane in the component. There may be a number of planes with such structures as shown in FIG. 11, and the structures do not need to be geometrically related to one another either. A configuration as shown in FIG. 12 may be advantageous if the aim is to reduce dynamic losses when switching off. The two-dimensional representation should be understood as meaning that layers of type 7 (in FIG. 3a) and 7' (in FIG. 3b) alternate with one another.

All the examples so far relate to structures 7 composed of dielectric insulating layers which are expediently formed by oxides in the silicon. However, the effect according to the invention also occurs when other insulating layers are used. The structures 7 do not need to consist solely of material which is highly insulating, and a very low level of electrical conductivity is normally permissible. This is even advantageous if the aim is to ensure that charges which occur in the insulator during long-term operation are compensated for. There is thus no need either to restrict the production of the structures 7 to methods which lead to approximately ideal dielectric structures.

The structures 7 are produced, for example, by use of the known SIMOX (Separation by Implantation of Oxygen) method (production of a buried insulating layer of silicon dioxide by high-energy implantation of oxygen ions). To this end, a portion of the layer 2 is deposited epitaxially in a known manner on the layer 3. Through the use of a photomask, and possibly a number of mask layers as well, a flat well is etched in the silicon in the areas of the structure 7. The subsequent SIMOX implantation produces an insulating structure 7 a few 100 nanometers under the surface, while the masked areas remain uninfluenced. Once the masks have been removed, the layer 2 is constructed further through the use of further epitaxy steps. The progressive structuring may be used to make it easier to produce a further structure 7.

However, instead of SIMOX, other implantations may also be carried out, provided they lead to insulating or semi-insulating layers. An insulation layer can also be produced on the well surface, but the subsequent epitaxy steps are more complex since they must be grown over laterally.

The additional n-doping, illustrated in FIGS. 8, 9, in the well area can be carried out in a simple manner in addition to the stated SIMOX implantation, using the same mask.

The examples so far have described components whose layer across which the voltage is dropped is n-doped, since this is the preferred embodiment. However, in principle, the effect also occurs with components of complementary configuration. Negative charges would, however, then be advantageous instead of positive charges in the dish structure 7.

The use of the measures according to the invention is also not, in principle, restricted to silicon components.

The measure according to the invention, that is to say the incorporation of the structures 7, is also suitable for improving another type of metal-semiconductor rectifier. As stated in the introduction to the description and with reference to FIG. 1, these rectifiers are advantageously provided with an additional grid structure, which shields the metal-semiconductor junction against strong electrical field strengths. However, precisely the same effect is achieved by providing the structures 7 sufficiently close to the metal-semiconductor junction as shown in FIG. 12. The field strength limit can easily be estimated, in a known manner, from Poisson's equation. An example is quoted for silicon Schottky diodes with n-doping. At a distance of 5 μm and with a doping concentration of $3 \cdot 10^{14}$ cm$^{-3}$, the field strength at the metal-semiconductor contact is limited to about $2.5 \cdot 10^4$ V/cm. However, in comparison to the structure shown in FIG. 1, the structure shown in FIG. 12 has the advantage that it is impossible for any minority carriers to be injected even when the currents are high.

Figure 13:
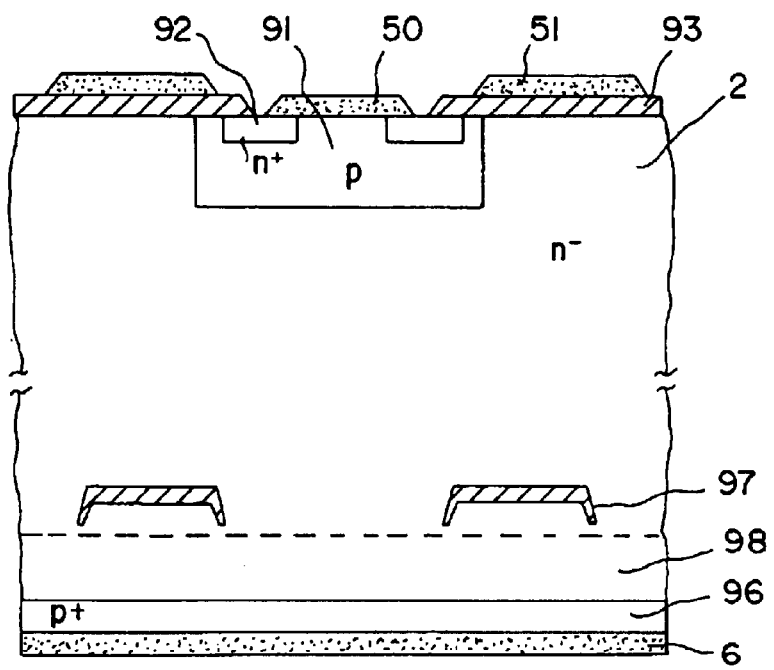
FIG. 13 is a diagrammatic, partial sectional view of a bipolar semiconductor component having shielding structures according to the invention.
Figure 14:
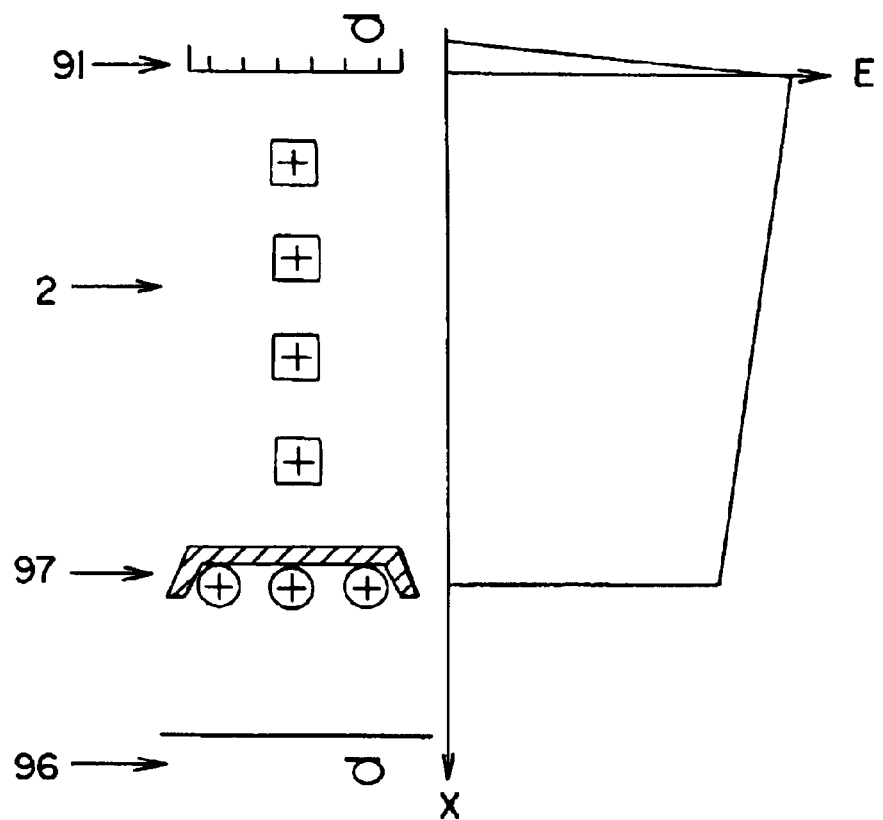
FIG. 14 is a graph illustrating a field strength profile in a semiconductor component according to the invention.

The structures 7 can also be used advantageously with bipolar components. One example is shown in FIG. 13. Here, the structures are incorporated in an insulated-gate bipolar transistor, to be precise with their edge bulge aligned to the P$^+$ emitter of the integrated pnp transistor. When, with the blocking voltage being dropped across it, the space-charge zone reaches the structures 97, they are charged with holes until further expansion of the space-charge zone is prevented. This is shown in FIG. 14. The effect achieved is thus precisely the same as that with the known "buffer" layers of PT-IGBTs (B. J. Baliga, "Modern Power Devices" (John Wiley & Sons, 1987)). However, it is expedient to additionally reduce the carrier life shortly in front of the P$^+$ emitter, that is to say in the area 98, in order to keep the current gain of the pnp transistor low.

Figure 15:
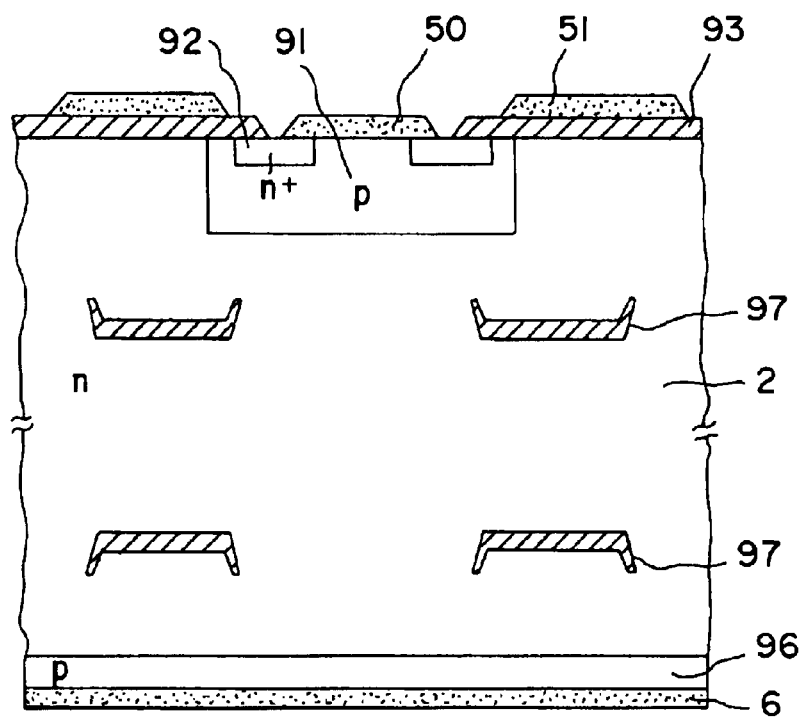
FIG. 15 is a diagrammatic, partial sectional view of a transistor component having shielding structures in several planes according to the invention.

The advantage over the known "buffer" structures is that the pn junction has a high blocking capability. IGBTs with a blocking capability on both sides can be configured in a particularly advantageous manner by providing the zones 7, 97 at both reverse-biased pn junctions, since the overall thickness of the n$^+$-layer can be reduced as is illustrated in FIG. 15.

Figure 16:
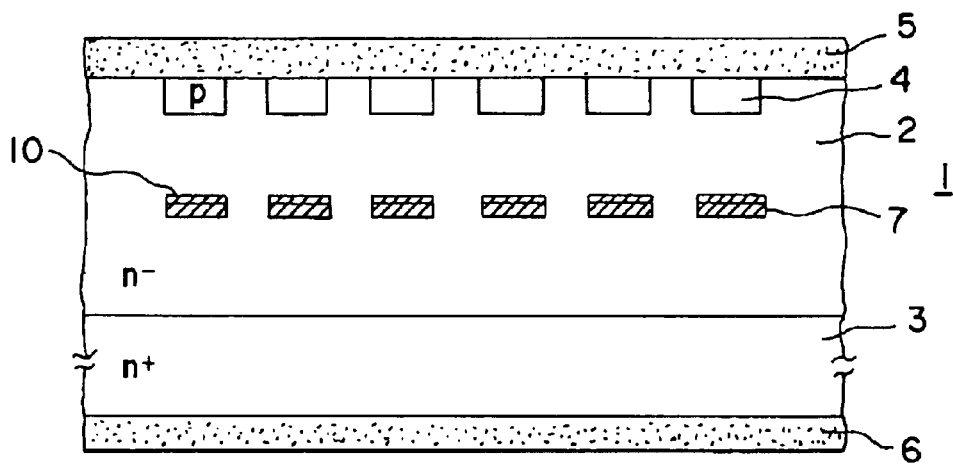
FIG. 16 is a diagrammatic, partial sectional view of a semiconductor component having shielding structures according to the invention.
Figure 17:
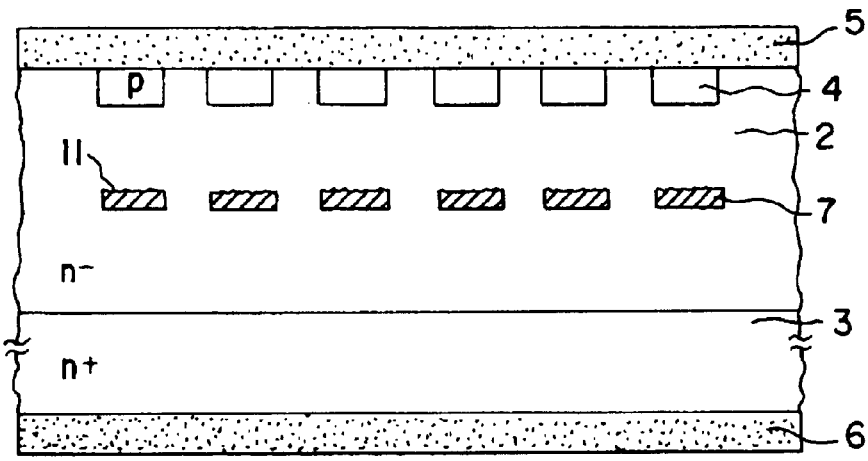
FIG. 17 is a diagrammatic, partial sectional view of a semiconductor component having shielding structures according to the invention.

In the exemplary embodiments so far, the structures 7, 7' and 97 are in the form of a dish, in which a positive or negative charge layer is produced by entrapment of charge carriers. Such entrapment is likewise achieved in the structures 7 which, as shown in FIG. 2b, are provided with an edge 9 where the doping concentration is increased. However, the structures 7 achieve the desired shielding function effect just from these structures being composed of highly insulating disks which are completely covered with a semi-insulating material 10, which has very low charge carrier mobility. It is also achieved if at least one outer surface of the structures is configured such that it is not smooth, but contains microscopic depressions 11 in any desired form, including a random form as is illustrated in FIGS. 16 and 17.

Figure 18:
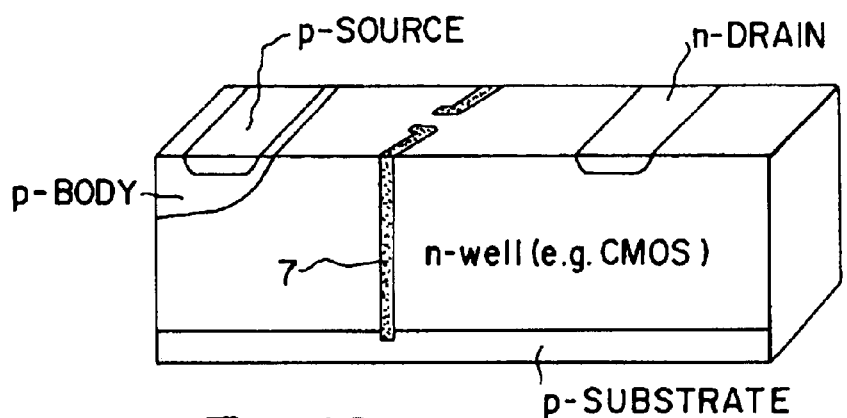
FIG. 18 is a diagrammatic perspective view of a semiconductor component having shielding structures according to the invention.

All the examples introduced so far relate to semiconductor components with a vertical current flow direction, that is to say at right angles to the outer surfaces of the chips. However, the effects are also achieved in components of lateral configuration, such as those used, in particular, for high-voltage integration. As an exemplary embodiment, FIG. 18 shows a lateral MOS transistor for high blocking capabilities. In this transistor, the source region and the p-body region are shielded from excessively high field strengths by the dielectric structures 7, which are now incorporated vertically with respect to the surface, thus resulting in a transistor configuration with a higher blocking capability for given switched-on resistances.

The advantage for lateral power components can also be achieved with other refinements of the dielectric or semi-insulating shielding structures 7. The embodiments described in the following text, which are intended primarily for protection of the edge area of the components, can also be used in a similar manner in lateral components.

The measure according to the invention can also be used to protect components against voltage breakdowns in the edge area. FIGS. 19a, b, c illustrate this using the example of a vertical component structure, to be precise on the basis of a power MOS field-effect transistor such as that already illustrated in FIG. 10. The edge area 100 is identified in FIGS. 19a, 19b, 19c. This figure does not illustrate the dielectric or semi-insulating shielding structures 7 shown in FIG. 10 because the measures according to the invention for protection of the edge area can also be used even for components according to the prior art.

FIG. 19a shows the profile of the space-charge zone 200 in the edge area of the power component, as is formed when a high blocking voltage is present and no measures whatsoever are taken to protect the edge area. This profile is typical of a very large number of types of power component in which the reverse-biased pn junction is produced through the use of planar technology, as is evident from the text book cited in the prior art. This text book also describes the curvature of the space-charge zone 200 leading to an increase in the field strength and in the edge area having a reduced blocking capability owing to charge carrier multiplication.

Figure 19C:
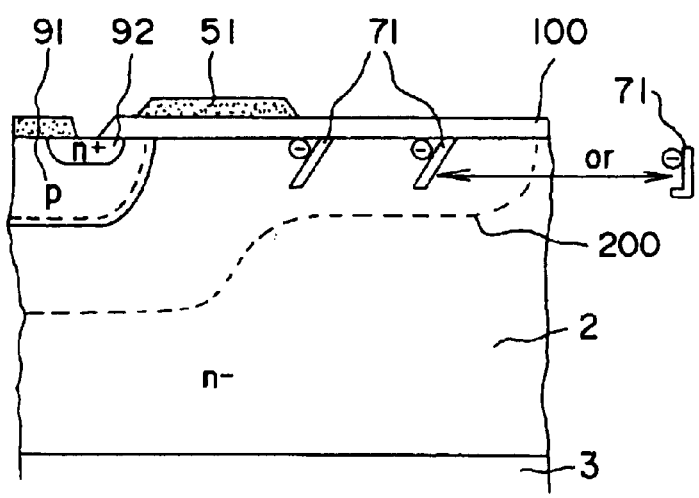
FIGS. 19a to 19c are diagrammatic, partial sectional views of components having shielding structures according to the invention.
Figure 19A:
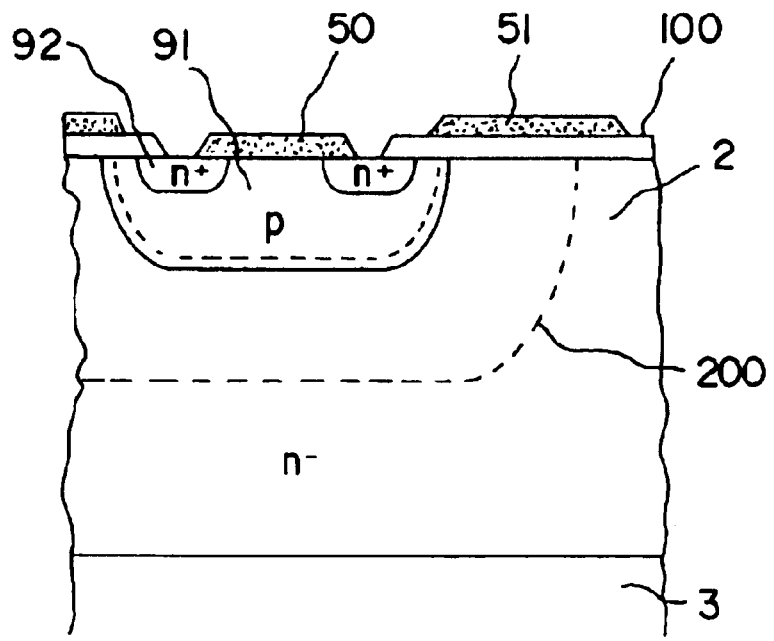
Figure 19B:
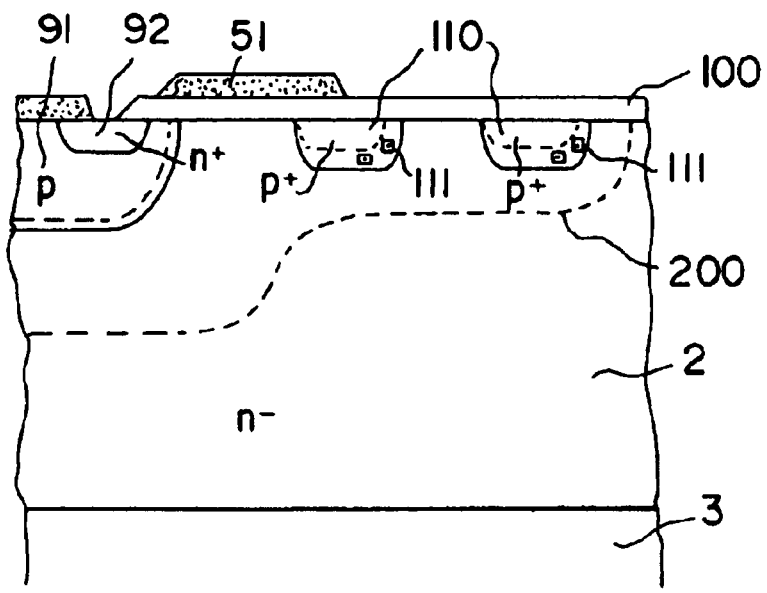

FIG. 19b shows one of the known measures used to reduce the field strength maximum in the curvature area of the space-charge zone 200, and thus to achieve an increased breakdown voltage. As is evident from the literature references cited with respect to the prior art, the effectiveness of most measures is based on expanding the space-charge zone 200 into the weakly doped layer 2. Such expansion is made possible through the use of various structures described there. The illustration shows what is referred to as a field ring structure 110, showing that negative charges 111 are formed at the inner edges of the field rings, and these reduce the curvature of the space-charge zone if the field ring structure 110 is configured in a suitable manner.

FIG. 19c shows an example of the measure according to the invention. Dielectric or semi-insulating shielding structures 71 are incorporated, which are at right angles to the profile of the edge field strength and, in addition, have an edge bend in the direction of increased field strength. The advantage achieved by the edge bend is also achieved when the shielding structures 71 are provided obliquely in a manner corresponding to the edge bend. The direction in which the charge carriers flow in the edge area is approximately parallel to the semiconductor surface. Such charge carriers are also produced through the use of thermal excitation or impact ionization when the component is in the reverse-biased state. As is evident from the description of the above examples (FIG. 6), moving charge carriers are trapped in these shielding structures, thus resulting in an effect which is analogous to that illustrated in the example in FIG. 19b, based on the field ring structure 110. The advantage of the measure according to the invention is that rings or layers with opposite doping can be avoided in the edge area.

Although what are referred to as field plate structures are explained in the literature relating to the prior art, through the use of which such opposite doping levels can be avoided, these are extremely complex, however, when the component is configured for a high blocking capability.

We claim:

1. A semiconductor configuration, comprising:
a semiconductor component including a first layer, a second layer adjacent said first layer, and dish-shaped structures disposed in said first layer, said semiconductor component defining a current flow direction along a movement direction of current-carrying charge carriers;
said second layer being a layer selected from the group consisting of a semiconductor layer and a metal layer forming an electrode for providing an electrical connection;
said dish-shaped structures being formed of a material selected from the group consisting of an insulating material and a semi-insulating material;
said dish-shaped structures having respective main surfaces extending substantially perpendicular to the current flow direction; and
said dish-shaped structures having respective edge regions bent up with respect to the current flow direction of the current-carrying charge carriers.

2. The semiconductor configuration according to claim 1, wherein:
said dish-shaped structures are configured as layer sequences of insulating material and semi-insulating material;
said dish-shaped structures have outer layers; and
at least one of said outer layers is composed of a semi-insulating material.

3. The semiconductor configuration according to claim 1, wherein:
said dish-shaped structures are composed of insulating material; and
each of said edge regions has an additional layer disposed in said edge region, said additional layer is composed of a material selected from the group consisting of an insulating material and a semi-insulating material.

4. The semiconductor configuration according to claim 1, wherein:
said first layer and said second layer form a rectifying junction;
further layers selected from the group consisting of semiconductor layers and metal layers are provided for making contact with said semiconductor component; and
said dish-shaped structures are disposed substantially parallel to said rectifying junction.

5. The semiconductor configuration according to claim 4, wherein said edge regions are bent up toward said rectifying junction.

6. The semiconductor configuration according to claim 1, wherein:
said edge regions are provided with a conductivity doping; and
said first layer has a given conductivity type, said conductivity doping has a conductivity type opposite the given conductivity type.

7. The semiconductor configuration according to claim 1, wherein a maximum distance between adjacent ones of said dish-shaped structures is less than a maximum extent of a space-charge zone in said first layer.

8. The semiconductor configuration according to claim 1, wherein said dish-shaped structures form a cohesive overall structure.

9. The semiconductor configuration according to claim 8, wherein said cohesive overall structure is formed with openings having a maximum diameter of less than a maximum extent of a space-charge zone in said first layer.

10. The semiconductor configuration according to claim 1, wherein said dish-shaped structures have respective outer surfaces formed with depressions facing the current flow direction.

11. The semiconductor configuration according to claim 4, wherein said dish-shaped structures have respective outer surfaces formed with depressions facing said rectifying junction.

12. The semiconductor configuration according to claim 1, wherein said first layer defines a plurality of planes, said dish-shaped structures are disposed in respective ones of the plurality of planes.

13. The semiconductor configuration according to claim 12, wherein spaces between respective ones of said dish-shaped structures disposed in a given one of the planes are each provided above further ones of said dish-shaped structures disposed in an adjacent one of the planes such that the spaces are each located above closed regions of the adjacent one of the planes.

14. The semiconductor configuration according to claim 1, wherein said dish-shaped structures are insulating structures with fixed charges introduced therein, said fixed charges are positive if said first layer conducts electrons, and said fixed charges are negative if said first layer conducts holes.

15. The semiconductor configuration according to claim 1, wherein each of said dish-shaped structures has a flat layer with an increased conductivity doping provided on at least one side of each of said dish-shaped structures, said flat layer having a conductivity type corresponding to a conductivity type of said first layer.

16. The semiconductor configuration according to claim 1, wherein said semiconductor component is a unipolar rectifier.

17. The semiconductor configuration according to claim 1, wherein said semiconductor component is a unipolar rectifier with shielding pn junctions incorporated therein, said shielding pn junctions being merged rectifier-type structures.

18. The semiconductor configuration according to claim 17, wherein said dish-shaped structures are located underneath said shielding pn junctions.

19. The semiconductor configuration according to claim 1, wherein said semiconductor component is a vertical field-controlled transistor.

20. The semiconductor configuration according to claim 19, wherein said semiconductor component has pn junctions formed with curvatures, said dish-shaped structures are disposed underneath said curvatures of said pn junctions where an electrical field strength assumes a highest value when a reverse voltage is applied.

21. The semiconductor configuration according to claim 1, wherein said semi-conductor component has a rectifying junction, said dish-shaped structures are disposed closer to said rectifying junction than required for limiting a semiconductor breakdown field strength.

22. The semiconductor configuration according to claim 1, wherein said semiconductor component is a vertical, bipolar semiconductor component having an integrated pnp transistor zone sequence with pn junctions, said dish-shaped structures are associated with one of said pn junctions used as a hole emitter.

23. The semiconductor configuration according to claim 1, wherein said semiconductor component has a p$^+$ emitter and given regions provided between said p$^+$ emitter and said dish-shaped structures such that a carrier life is shortened in said given regions.

24. The semiconductor configuration according to claim 22, wherein said dish-shaped structures are assigned to respective ones of said pn junctions of said integrated pnp transistor.

25. The semiconductor configuration according to claim 1, including shielding structures introduced from a surface of said semiconductor component and disposed in an edge region of said semiconductor component, said shielding structures have edges bent up toward a rectifying pn junction of said semiconductor component.

26. The semiconductor configuration according to claim 1, including shielding structures introduced from a surface of said semiconductor component and disposed in an edge region of said semiconductor component, said shielding structures being incorporated obliquely such that said shielding structures form edges bent toward a rectifying pn junction of said semiconductor component.

27. A method for producing a semiconductor configuration, the method which comprises:

forming a layer with a given thickness;

producing, in the layer, one of insulating structures and semi-insulating structures by photochemical masking processes and implantation of ions, the one of insulating structures and semi-insulating structures being dish-shaped, and having respective main surfaces extending substantially perpendicular to a current flow direction and respective edge regions bent up with respect to the current flow direction; and further building up the layer to a thickness greater than the given thickness by using epitaxy steps subsequent to removing a photo mask.

28. The method according to claim 27, which comprises:

forming depressions in a geometric configuration of the one of insulating structures and semi-insulating structures through the use of wet-chemical or dry-chemical etching processes before the implantation; and forming the one of insulating structures and semi-insulating structures with a same masking as used for forming the depressions.

29. The method according to claim 27, which comprises producing additional semi-insulating layers with a same masking as used for forming the one of insulating structures and semi-insulating structures.

30. The method according to claim 27, which comprises producing additional layers of increased dopant concentration with a same masking as used for forming the one of insulating structures and semi-insulating structures.

31. The method according to claim 27, which comprises producing the one of insulating structures and semi-insulating structures by implanting one of oxygen and nitrogen.

* * * * *

UNITED STATES PATENT AND TRADEMARK OFFICE
CERTIFICATE OF CORRECTION

PATENT NO.    : 6,734,520 B2
DATED         : May 11, 2004
INVENTOR(S)   : Holger Kapels et al.

It is certified that error appears in the above-identified patent and that said Letters Patent is hereby corrected as shown below:

<u>Title page,</u>
Item [30], Foreign Application Priority Data, should read as follows:
--     Nov. 18, 1998     (DE)   .......... 198 53 040
    Feb. 6, 1998     (DE)   .......... 199 04 865 --

Signed and Sealed this

Sixth Day of July, 2004

JON W. DUDAS
*Acting Director of the United States Patent and Trademark Office*